United States Patent [19]

Tressa

[11] 4,028,645
[45] June 7, 1977

[54] AUTOMATIC IMPEDANCE MATCHING USING RESISTIVE AND REACTIVE DIODES

[75] Inventor: Frank J. Tressa, Deer Park, N.Y.

[73] Assignee: The United States of America as represented by the Secretary of the Army, Washington, D.C.

[22] Filed: June 21, 1976

[21] Appl. No.: 698,447

[52] U.S. Cl. .............................. 333/17 M; 325/24; 343/180
[51] Int. Cl.² .......................................... H03H 7/40
[58] Field of Search .................. 343/852, 861, 180; 333/11, 17 M; 325/177, 8, 22–24

[56] References Cited

UNITED STATES PATENTS 3,617,953  11/1971  Kingma et al. .................. 333/17 M Primary Examiner—Paul L. Gensler
Attorney, Agent, or Firm—Nathan Edelberg; Michael Zelenka; Sheldon Kanars

[57] ABSTRACT

An impedance matching device is disclosed which automatically maintains high isolation between two opposite ports of a four port hybrid while the impedance of one of the other ports varies randomly. The device operates by sampling the signal at the output of the port it is desired to isolate and adjusting the impedance of the port opposite the port of randomly varying impedance in such a way as to minimize the sampled signal and thereby maintain isolation.

7 Claims, 1 Drawing Figure

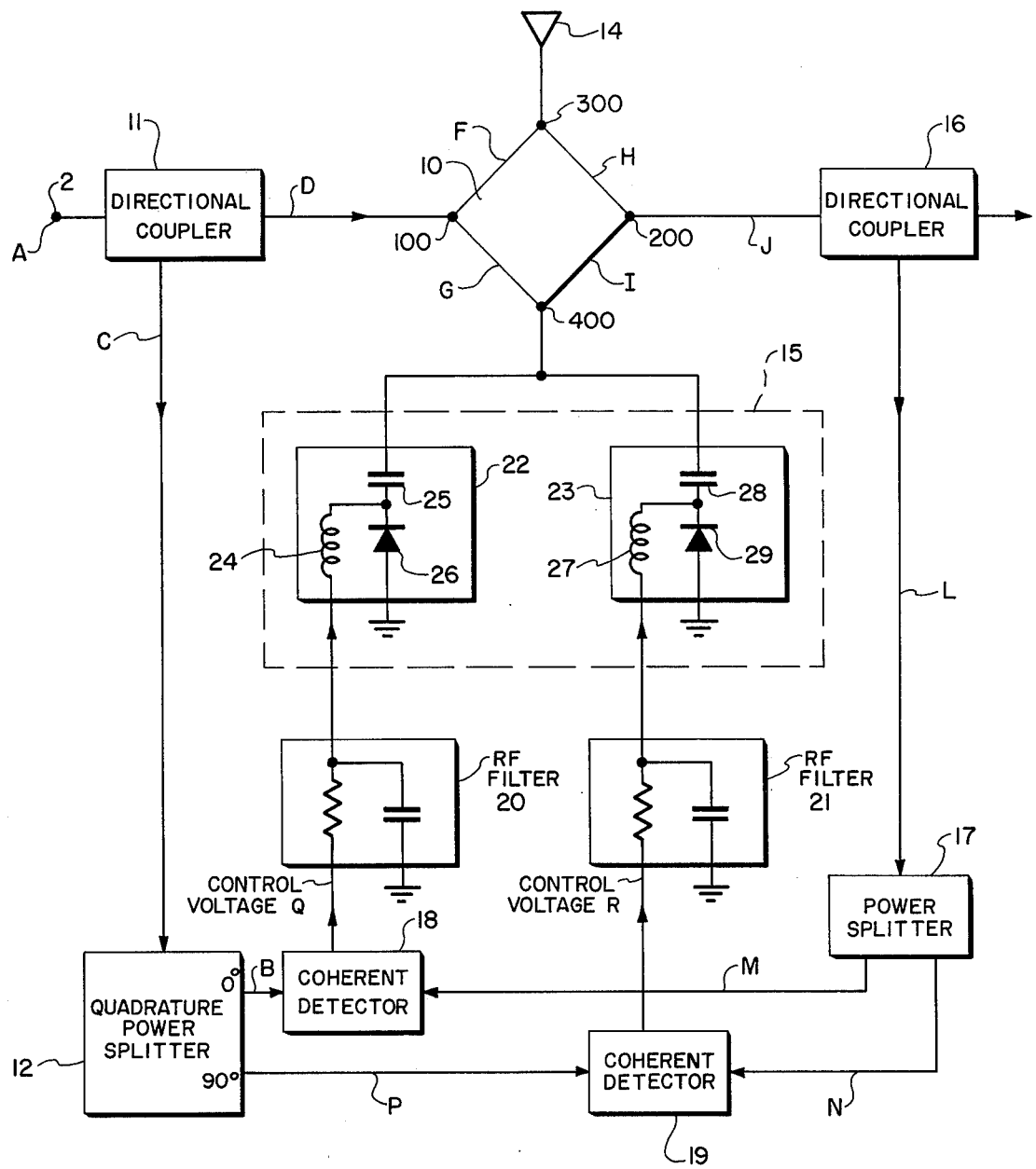

AUTOMATIC IMPEDANCE MATCHING USING RESISTIVE AND REACTIVE DIODES

BACKGROUND OF THE INVENTION

The background of the invention might best be understood through the discussion of a problem which exists in $F_1F_1$ frequency repeaters. An $F_1F_1$ frequency repeater is a device wherein a weak radio signal of a given frequency is received and a signal of the same frequency but greater amplitude is retransmitted. The broadcast and received signals utilize the same antenna, the transmitter and receiver being connected to said antenna through the use of a four port hybrid. Thus the situation is one wherein the receiver and transmitter are connected to opposite ports of the four port hybrid and the antenna is connected to one of the other two ports. The remaining open port has in the past been terminated by a fixed impedance which compensates for the impedance of the antenna. The system operates in the following manner.

A signal from the transmitter is introduced at the transmitter port. There the signal divides into two signals 180° out of phase, one of which is routed toward the antenna port and the other of which is routed toward the load port. The largest portion of the signal reaching the antenna port travels out the antenna into free space. A secondary portion of this singal, however, is reflected back into the antenna port. This reflected signal travels to the receiver port. During the same time period a portion of the signal which has been coupled to the load port is reflected to the receiver port. It is desirable to minimize the signal reflected from the antenna port which enters the receiver port in an $F_1F_1$ repeater since a signal of sufficient amplitude may lead to a condition of oscillation. To prevent this condition the impedance at the load port is judiciously selected to simulate the impedance at the antenna port so that the signals reflected to the receiver port are equal in magnitude but 180° out of phase and will therefore cancel. Operation of the system therefore is degraded when the antenna port is connected to an unstable impedance such as an antenna swaying in the wind. As a result of this instability the two signals arriving at the receiver port will not be of the same magnitude and 180 degrees out of phase and the introduction of an undesired signal into the receiver will result. If this signal is of sufficient magnitude the oscillation condition mentioned previously may occur.

One object of this invention is to automatically maintain the proper amplitude and phasing of the signal reflected from the load port in order to provide for maximum cancellation at the receiver port while the antenna port impedance varies randomly. A second object of the invention is to provide a repeater system which simultaneously broadcasts and receives at essentially the same frequency while utilizing a single whip antenna.

SUMMARY OF THE INVENTION

The invention utilizes a variable impedance at the load port of the four port hybrid and continuously adjusts that impedance in order to minimize the leakage signal which reaches the receiver. Determination of the manner of variation of the impedance is accomplished as follows. The input signal to the transmitter port of the hybrid is sampled by means of a directional coupler before entering the hybrid in order to provide a reference signal. This reference signal is passed through a quadrature power splitter. A quadrature power splitter has two outputs of equal amplitude but shifted in phase by 90 degrees. These two outputs are fed to identical coherent detectors which only produce an output when the signal of interest is coherent with the reference signal. The operation of the coherent detectors as used in this application is such that when the signal of interest is in phase with a reference signal, there is a maximum D.C. output. When the signal is at 90° to the reference signal the output of the detector is zero. When the signal is 180° out of phase with the reference signal the D.C. output is again maximum but of opposite polarity. The reference signal applied to the coherent detectors is obtained by sampling the signal at the receiver port by means of a directional coupler and splitting that signal in a power splitter with two equiphased outputs. By use of the two coherent phase detectors error signals are derived that are related to the phase angle and amplitude of the leakage signal appearing at the antenna port. These error signals are then used to adjust the R and X components of the impedance at the load port in order to reduce the uncancelled signal which leaks into the receiver port.

While this description has been written in terms of antenna, receiver and transmitter ports this invention is applicable to any four port hybrid application where isolation between two opposite ports is desirable.

BRIEF DESCRIPTION OF THE DRAWING

The sole FIGURE illustrates a block diagram of the invention.

DETAILED DESCRIPTION OF THE INVENTION

As shown in the drawing, the four port hybrid has a transmitter port 100, a receiver port 200, an antenna port 300 and a load port 400. The ports are arranged so that the transmitter and receiver ports and the antenna and load ports form opposed pairs. For the purpose of this description a four-port hybrid has an operating characteristic such that when a sinusoidal R.F. signal is introduced at the transmitter port 100 the signal is divided and the resulting signals, which are not necessarily of equal magnitude but which are 180° out of phase with each other, are sent toward the antenna and load ports 300, 400.

Initially the signal to be transmitted, A, is introduced at point 2. Signal A then enters directional coupler 11 where a portion of that signal, which portion is hereinafter referred to as C, is sampled and fed to quadrature power splitter 12.

The function of quadrature power splitter 12 is to divide the signal C into two signals of equal magnitude each having half the magnitude of signal C. One of these signals, hereinafter referred to as signal B is in phase with signal C. The second signal, hereinafter referred to as signal P, is shifted 90° in phase with respect to signal C. Signals B and P serve as reference signals for the coherent detectors 18, 19 as will be discussed subsequently herein.

The remainder of signal A which is not fed to the quadrature power splitter 12 is hereinafter referred to as signal D. This signal D is introduced into the transmitter port 100 of the four port hybrid 10. At the transmitter port 100, the signal D divides into two signals F and G. Signal F follows the path from the transmitter port 100 to the load port 400. As was previously noted signal G is 180° out of phase with signal F which is characteristic of the hybrid used. Because of mismatch of the antenna 14 a portion of the signal F, which portion will be referred to herein as signal H, travels from the antenna port 300 to the receiver port 200. Similarly, because of a mismatch at the load port 400 a portion of signal G, which portion will be referred to herein as signal I, travels from the load port 400 to the receiver port 200. If the variable impedance at the load port 400 is properly adjusted with respect to the impedance at the antenna port 300 the two signals H and I will be of the same magnitude but 180° out of phase and will therefore cancel. If the variable impedance 15 at the load port 400 differs from the properly adjusted impedance the signals will not cancel perfectly and that portion of the signal which does not cancel, which will be referred to herein as signal J, enters the receiver port 200. It is desirable to keep this signal J at a minimum. To that end the signal J is sampled through the use of a directional coupler 16 upon its entry into the receiver port 200. This sample signal, hereinafter referred to as signal L, is coupled to a power splitter 17. The power splitter 17 has the property of dividing the signal into two equal signals without affecting the phase thereof. One of these signals, M, is coupled to a first coherent detector 18 and the other, N, to a second coherent detector 19. These first and second coherent detectors 18, 19 are identical, are responsive only to coherent signals, and operate in a manner such that when the input signal is in phase with a reference signal there is a maximum D.C. output. When the input signal is at 90° to the reference signal the output of the detector is zero. Finally, when the input signal is 180° out of phase with the reference signal, the D.C. output is again maximum but of the opposite polarity. Since the coherent detectors have no output when the input and reference signals are not coherent, those signals entering the receiver port which originate at a remote transmitter never produce a coherent detector output and therefor never affect the impedance at the load port. The input signals in this case are signals M and N respectively and the reference signals are signals B and P discussed earlier and which were derived from the quadrature power splitter 12. Therefore, between the two coherent phase detectors, two D.C. control voltages Q and R can be derived that are a function of the phase angle and amplitude of a signal J which enters the receiver port 200.

D.C. control voltages Q and R are coupled to the variable impedance 15 which terminates the load port 400 through two identical R.F. filters 20, 21 which filter any R.F. leakage signal from the coherent detectors 18 and 19 to ground. Adjustment of the resistive and reactive components 22, 23 of the impedance 15 is accomplished in a similar manner as will be seen from the description which follows.

The resistive component 22 of the impedance 15 is comprised of an R.F. choke 24, a blocking capacitor 25 and a PIN diode 26. A PIN diode has the characteristic of changing its resistance as a function of the D.C. voltage applied across it. In this application one end of the PIN diode 26 is held at ground potential while the voltage applied across it is the D.C. control voltage Q. This D.C. control voltage Q is applied through R.F. choke 24. R.F. choke 24 prevents any R.F. signal from the load port 400 of the four port hybrid 10 from leaking into the coherent detector 18. The PIN diode 26 is coupled to the load port 400 of the four port hybrid 10 through blocking capacitor 25. The purpose of blocking capcitor 25 is to prevent the D.C. control voltage from effecting the load port 400. A similar arrangement is used in the reactive component of the impedance 23. There the PIN diode is replaced by varactor diode 29 which changes capacitance as a function of the D.C. voltage applied across it. R.F. filter 21, choke 27 and blocking capacitor 28 perform the same function with respect to the complex portion of the impedance as RF filter 20, choke 24 and blocking capacitor 25 perform with respect to the real part of the impedance.

Numerous variations on this impedance design are desirable in specific applications. Constant D.C. bias voltages may be applied across the PIN and varactor diodes to establish a base value around which the impedance could fluctuate as a function of the D.C. control voltages Q and R. In another alternative a fixed or variable impedance may be connected in series or parallel with that effected by the D.C. control voltages Q and R again establishing a base value around which the overall impedance could vary. Similarly amplification of the D.C. bias voltages might prove desirable in many circumstances. As in any feedback application loop parameters must be selected so as to insure conformance with Myquist stability criteria and well known feedback design.

What is claimed is:

1. An automatic impedance matching device for isolating opposite ports of a four port hybrid, the four ports being designated the transmitter, antenna, receiver and load ports, comprising:

first sampling means for providing a first sample of an input signal prior to the signals introduction into the transmitter port of the hybrid;

first power splitting means, electrically coupled to said first sampling means for dividing said first sampled signal into first and second reference signals having equal magnitude and a 90° phase difference as a result of said second reference signal being shifted 90° in phase;

a first coherent detector, electrically coupled to said first power splitting means, and utilizing said first reference signal as a reference;

a second coherent detector, electrically coupled to said first power splitting means, and utilizing said second reference signal as a reference;

second sampling means for sampling a mismatch signal at the receiver port of the four port hybrid;

second power splitting means, having an input and two outputs, the input of which is coupled to said second sampling means and the outputs of which are coupled to said first and second coherent detectors, the function of said second power splitting means being to provide two output signals of equal magnitude having the same phase as the sampled mismatch signal from said second sampling means; and a variable impedance which terminates the load port of the four port hybrid having a variable reactance portion, the value of the reactance portion being a function of the output of the second coherent detector and the value of the resistance portion being a function of the output of the first coherent detector.

2. The automatic impedance matching device of claim 1 wherein the first sampling means is a directional coupler.

3. The automatic impedance matching device of claim 2 wherein the first power splitting means is a quadrature power splitter.

4. The automatic impedance matching device of claim 3 wherein the second sampling means is a directional coupler.

5. The automatic impedance matching device of claim 4 wherein the variable reactance portion of the variable impedance terminating the load port comprises a varactor diode coupled to the load port of the hybrid through a blocking capacitor.

6. The automatic impedance matching device of claim 5 wherein the variable resistance portion of the variable impedance terminating the load port comprises a PIN diode coupled to the load port through a blocking capacitor.

7. An automatic impedance matching circuit for maintaining isolation between two opposite ports of a four port hybrid in spite of random impedance variations at a third port said hybrid comprising:
   means to sample the signals at both of the two said opposite ports;
   coherent detector means coupled to said sampling means for deriving two DC signals related to the amount of leakage between said opposite ports;
   an electronically variable impedance, connected to the fourth port of said hybrid; and
   means to electronically vary said variable impedance in response to said DC signals in such a manner as to minimize the coupling between said opposite ports.

* * * * *